(12) United States Patent  
Morishige

(10) Patent No.: US 6,678,304 B2
(45) Date of Patent: Jan. 13, 2004

(54) LASER CORRECTION METHOD AND APPARATUS

(75) Inventor: Yukio Morishige, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/934,429

(22) Filed: Aug. 21, 2001

(65) Prior Publication Data

US 2002/0023907 A1 Feb. 28, 2002

(30) Foreign Application Priority Data

Aug. 22, 2000 (JP) .................................. 2000-250900

(51) Int. Cl.[7] .............................. H01S 3/223; A23G 3/20
(52) U.S. Cl. ...................... 372/55; 118/720; 118/721; 118/715
(58) Field of Search ................. 219/121.84, 85; 216/121.86; 430/5; 118/715, 720, 721, 722; 372/55

(56) References Cited

U.S. PATENT DOCUMENTS

| 4,636,403 | A | * | 1/1987 | Fisanick et al. ............ 427/53.1 |
| 4,873,413 | A | * | 10/1989 | Uesugi et al. ......... 219/121.68 |
| 5,155,322 | A | * | 10/1992 | McClellan et al. .... 219/121.63 |
| 5,229,081 | A | * | 7/1993 | Suda ......................... 427/186 |
| 6,130,397 | A | * | 10/2000 | Arai ...................... 219/121.37 |
| 6,136,096 | A | * | 10/2000 | Morishige ................... 118/720 |
| 6,333,130 | B1 | * | 12/2001 | Morihige ....................... 430/5 |
| 6,444,039 | B1 | * | 9/2002 | Nguyen ....................... 118/715 |
| 6,517,642 | B2 | * | 2/2003 | Horie et al. ................ 148/220 |

FOREIGN PATENT DOCUMENTS

| JP | 56-111227 | 9/1981 |
| JP | 63-36249 | 2/1988 |
| JP | 2-97945 | 4/1990 |
| JP | 4-34824 | 2/1992 |
| JP | 7-104459 | 4/1995 |
| JP | 10-280152 | 10/1998 |
| JP | 11-264961 | 9/1999 |

OTHER PUBLICATIONS

Copy of Japanese Office Action dated Jun. 10, 2003 (and English translation of relevant portion).

* cited by examiner

*Primary Examiner*—Paul Ip
*Assistant Examiner*—Phillip Nguyen
(74) *Attorney, Agent, or Firm*—Dickstein, Shapiro, Morin & Oshinsky, LLP.

(57) ABSTRACT

A laser correction apparatus irradiates a laser upward onto a defect on a photomask formed on the bottom surface thereof. The particles generated by the laser irradiation is removed by blowing a gas to the space between the bottom surface of the substrate and a window port. The window port has a top flat surface having a central opening and an inner wall having a top portion of a funnel shape and a bottom portion of a cylindrical shape. The gas introduced to the space passes the central opening, forms a spiral flow while increasing the diameter thereof, and is exhausted from gas outlet ports formed on the cylindrical portion.

9 Claims, 5 Drawing Sheets

LASER CORRECTION METHOD AND APPARATUS

BACKGROUND OF THE INVENTION (a) Field of the Invention

The present invention relates to a defective circuit correction method and apparatus, and more specifically to a laser correction method and apparatus for correcting fine patterns on substrates such as a photomask for forming an LSI.

(b) Description of the Related Art

A conventional laser correction apparatus has a laser-irradiating microscopic system disposed above the substrate for irradiating a laser. The substrate is irradiated by a laser from above to evaporate a Cr film on defective spots for removal. A conventional laser correction apparatus is described in Japanese Patent Laid-Open Publication No. Sho. 56-111227, entitled "Laser Working Device with Projection Method Using Iris Diaphragm". This method uses a high precision defect machining technique with a laser irradiation unit added to an ordinary microscopic system. A laser beam, which is collimated with slits, is transmitted through an objective lens from above the substrate, and then the image of the slits is focused on the pattern formed on the substrate.

On the other hand, Japanese Patent Laid-Open Publication No. Hei. 7-104459 entitled "Defect Correction Method and Device for Photomask", describes a method of removing by evaporation a Cr film on the substrate by directing the pattern surface downward and then irradiating the pattern with a laser penetrating the substrate from the rear side of the substrate. The described technique indicates that the re-deposition of evaporated fine particles onto the substrate is suppressed since the pattern surface is directed downward and the evaporated particles fall downward due to gravity. Besides, it is recited that there is another advantage of suction of falling fine particles with an exhaust mechanism installed along the optical axis under the substrate.

The former conventional laser correction technique by which the substrate is irradiated by a laser from above has a problem in that evaporated fine particles may re-deposit onto the substrate and cause defects. This problem has not been identified because such defects were beyond measurement in the current technique. However, since the semiconductor structures have become smaller than ever, even fine particles as small as around 0.1 $\mu$m that were not recognized heretofore as causing specific defects are recognized now as a source of defects. Thus, there appears to be a need to correct such defects. Consequently, it becomes necessary to reduce the re-deposition of fine particles during the laser correction process.

On the other hand, the latter conventional method for correcting detects by irradiating the substrate with a laser from above, with the pattern surface being directed downward, has another problem. The problem is that the precision of a laser image formed deteriorates because the substrate is irradiated by the observation light or laser light, which causes parallel plate aberration of the substrate. Also in this case, it is difficult to observe fine patterns from the rear side of the substrate. The deposition of relatively large fine particles of 0.2 $\mu$m or larger onto the substrate is almost completely prevented by installing a suction port under the substrate. However, there is still a problem in that some of the fine particles smaller than 0.2 $\mu$m are observed to re-deposit onto the substrate within a 20 $\mu$m distance from the laser-irradiated spot since these particles take time to ride on the suction stream and consequently stay near the substrate.

SUMMARY OF THE INVENTION

It is, therefore, an object of the present invention to provide a laser correction method and apparatus that can prevent re-deposition of fine particles created by the laser irradiation of the substrate, substantially without degrading the laser focusing characteristics and without reducing the ability to observe the fine patterns.

Another object of the present invention is to provide a laser correction method and apparatus that can prevent the deposition of fine particles created during the laser correction onto optical components such as an objective lens. A further object of the present invention is to provide a laser correction method and apparatus can handle both opaque and clear defects.

The present invention provides a laser correction apparatus including: a laser source for emitting laser; an optical system having an objective lens for irradiating upward the laser and focusing the laser onto a defect on a thin film formed on a bottom surface of a substrate; a window port interposed between the bottom surface of the substrate and the objective lens, the window port including a top surface opposing the bottom surface of the substrate with a space therebetween and having a central opening for allowing the laser to pass therethrough, and an inner wall including an upper portion extending from the central opening and a lower portion having a larger diameter than the upper portion, the lower portion having a plurality of gas outlet ports therein; a gas source for introducing a gas to the space between the bottom surface of the substrate and the top surface of the window port from a periphery of the top surface toward the central opening, the central opening allowing the gas to pass therethrough toward the inner wall; and a gas exhaust section for exhausting the gas through the gas outlet ports.

The present invention also provides a method for correcting a defect on a thin film formed on a bottom surface of a substrate by using the laser correction apparatus of the present invention, the method including the step of irradiating a focused laser onto the defect through the central opening while blowing a gas to the space from a periphery of the top surface and exhausting the gas through the central opening.

In accordance with the laser correction apparatus and method of the present invention, the particles generated by the laser irradiation can be removed by the gas flow penetrating the central opening and then advancing downward in a spiral flow toward the gas outlet ports.

The above and other objects, features and advantages of the present invention will be more apparent from the following description, referring to the accompanying drawings.

DESCRIPTION OF THE PREFERRED EMBODIMENTS

Figure 1:
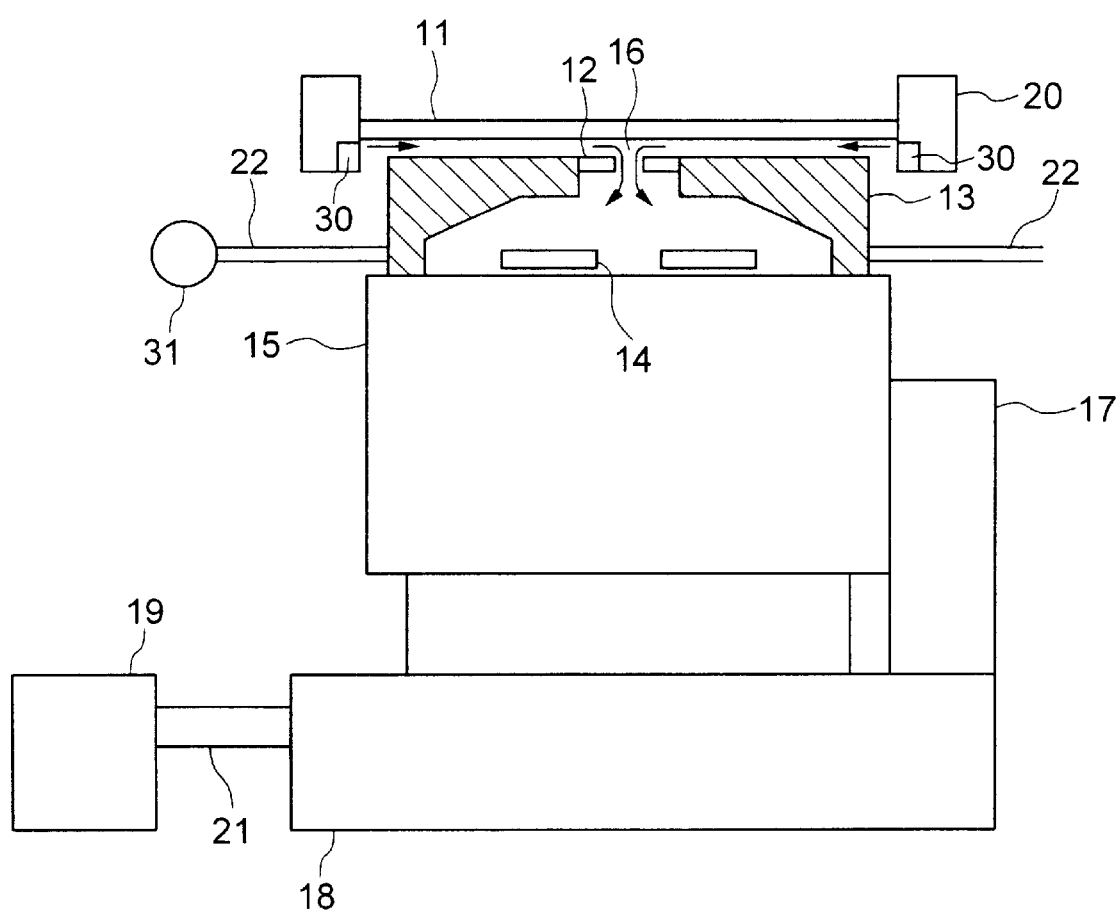
FIG. 1 is a side view including a partly sectional view of a laser correction apparatus according to a first embodiment of the present invention.

Now, the present invention is more specifically described with reference to accompanying drawings, wherein similar constituent elements are designated by similar reference numerals. Referring to FIG. 1, there is shown a laser correction apparatus according to a first embodiment of the present invention, along with an enlarged partial sectional view of a laser irradiation area. This configuration of the laser correction apparatus is suitable for correcting opaque defects in an LSI photomask.

In FIG. 1, a mask substrate 11 is fixed onto an X-Y stage with the patterned side or pattern surface of the mask substrate 11 being directed downward. Under the mask substrate 11, a window port 13 made of a metal such as stainless steel and an objective lens 15 are positioned, the objective lens 15 being located below the window port 13. A microscopic optical system 18 has the objective lens 15 facing upward, an up/down mechanism 17 that moves the objective lens 15 up and down and a laser inlet port 21 through which a laser emitted from a laser source 19 is introduced. The microscopic optical system 18 is positioned under the mask substrate 11 and has a laser irradiation mechanism as well as an optical system for observing the magnified image of the mask substrate within the microscopic optical system 18. A plurality of gas inlet ports 30 are disposed on the X-Y stage.

The upper inner surface of the window port 13 is formed as a funnel-like wall, which is located outside the projection angle determined by NA of the objective lens 15. The lower inner surface of the window port 13 is formed as a cylindrical wall extending downward from the lower end of the funnel-like wall having a larger diameter than the upper end thereof. The window port 13 has four gas outlet ports 22 including suction holes 14, which are located symmetrically around the central axis of the cylindrical wall in the vicinity of the bottom of the cylindrical wall.

Figure 2:
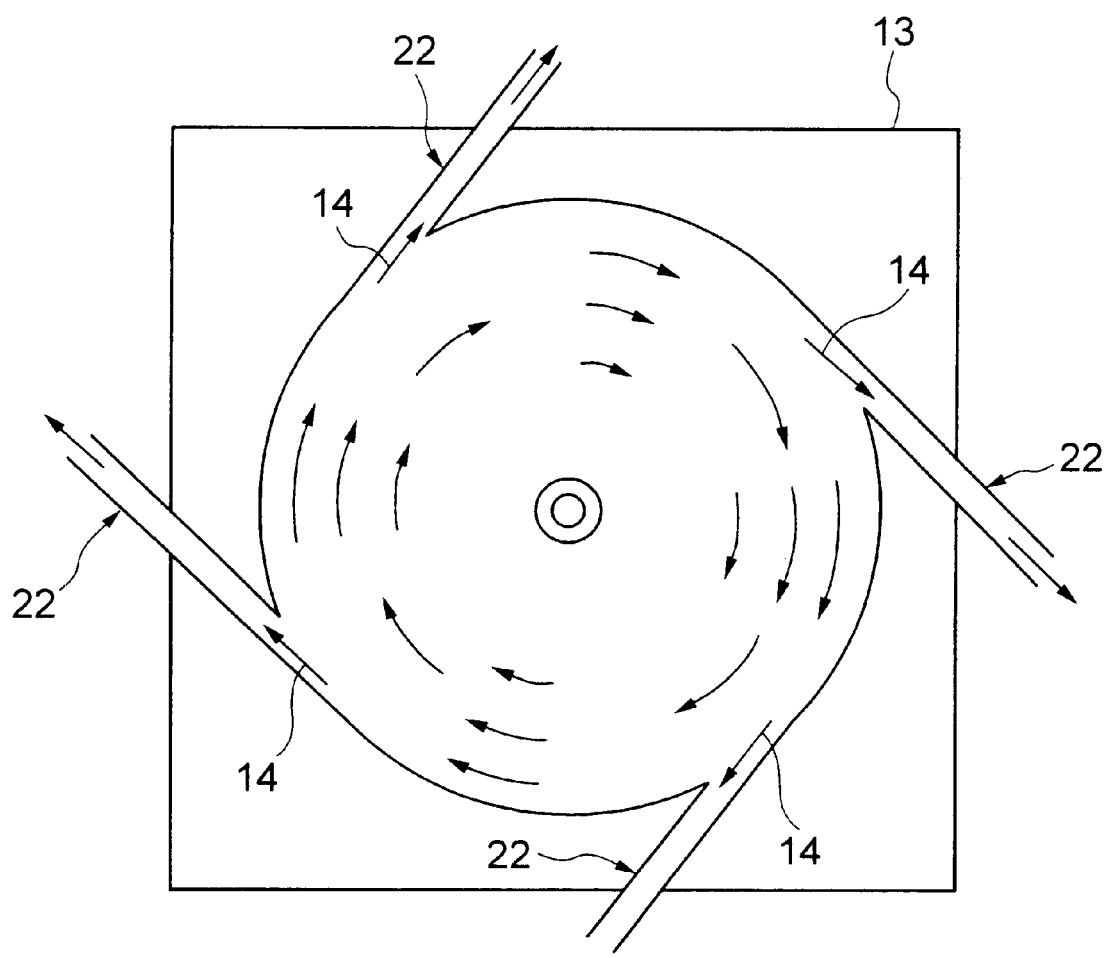
FIG. 2 is a horizontal sectional view of the window port shown in FIG. 1.

FIG. 2 is a sectional view of the window port 13, showing its structure across a horizontal plane crossing the centers of the four suction holes 14. The suction holes 14 are installed through the inner wall of the window port 13 so that the air near the suction holes 14 flows along the circumference of the cylindrical wall of the window port 13. This structure together with the funnel-like wall creates a high-speed spiral airflow moving inside the window port 13 toward the four suction holes 14 installed through the cylindrical side wall.

Figure 3:
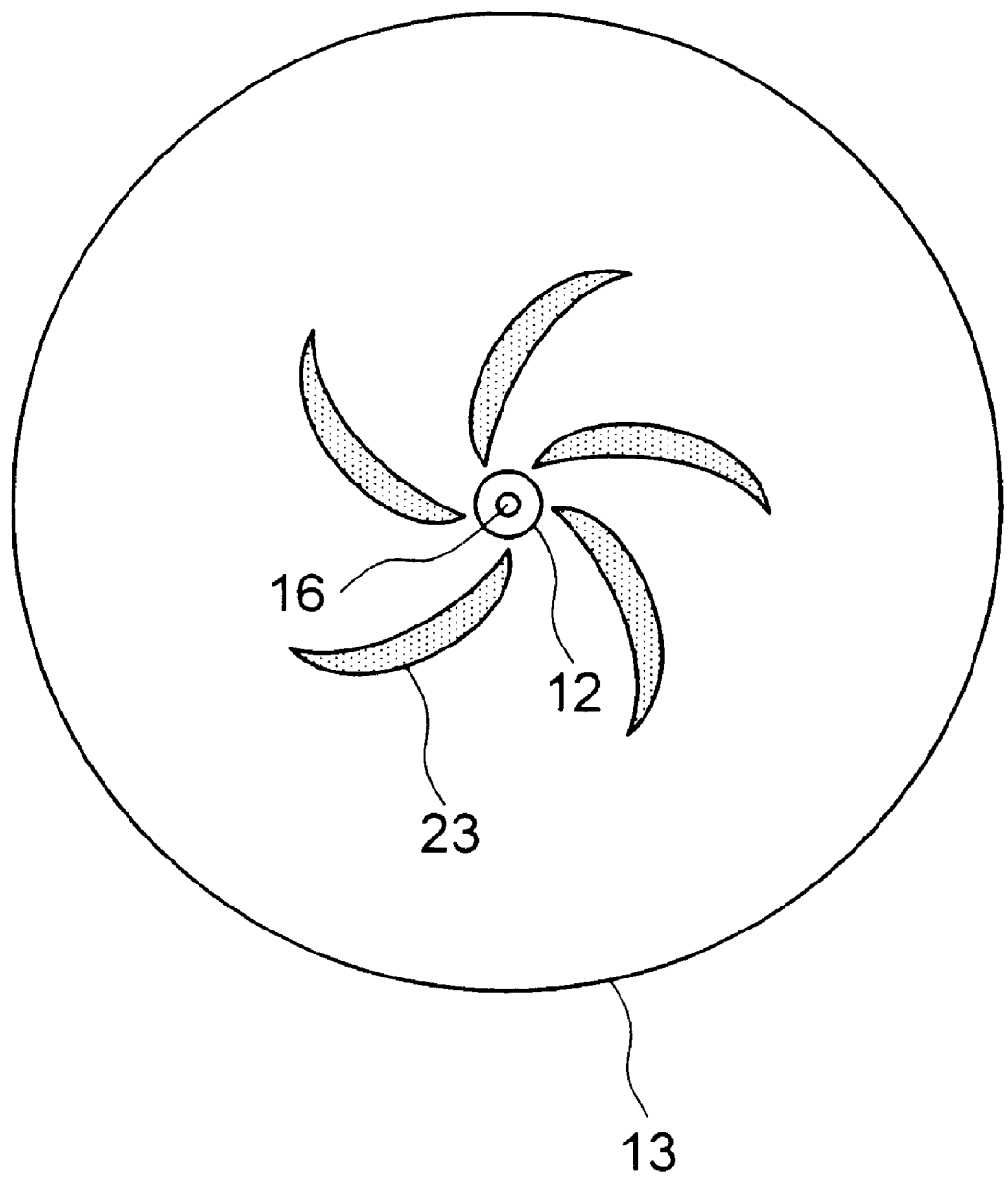
FIG. 3 is a top plan view of the window port shown in FIG. 1.

FIG. 3 shows the outer surface of the window port 13, particularly its top surface opposing the mask substrate 11. The window port 13 is made of a metallic plate having a circular opening in its center where a glass window 12 is mounted. The glass window 12 has in its center, namely the position directly underneath the laser-irradiated area of the mask substrate 11, an opening 16 with a diameter of 0.5 mm. Further, on the top metal surface, several protrusions 23 are formed that are in the form of a spiral having an inner end directed to the round opening 16 and extending outwardly from the round opening 16. The height of these protrusions 23 is about 0.1 mm. The arrangement of these protrusions 23 represents that of the blades of a fan cut by a plane perpendicular to the rotational axis thereof.

A vacuum pump 31 is connected to the gas outlet ports 22 of the window port 13 having the structure shown in FIGS. 2 and 3, for exhausting the gas to remove along with the gas the fine particles created by laser irradiation onto the defects of the mask substrate.

Close to the laser-irradiated area on the mask substrate 11, the spiral protrusions 23 formed on the top surface of the window port 13 create a high-speed spiral flow that runs from the outer peripheral side of the mask substrate 11 toward the laser-irradiated area, namely, the opening 16 in the glass window 12 of the window port 13. Then, the fine particles created by the laser irradiation ride on this flow and are sucked into the inside of the window port 13 through the opening 16. Inside the window port 13, the radius or diameter of the spiral flow increases as the spiral flow goes down and thus fine particles are blown and collected toward the cylindrical portion of the inner wall. Finally, the fine particles are sucked into the suction holes 14 and exhausted to the outside of the window port 13 through the gas outlets 22.

According to the structure as described above, the fine particles created by laser irradiation onto the mask substrate 11 are sucked through the opening 16 by the high-speed horizontal flow directed towards the center near the laser irradiated area and the downward flow directed towards the opening. As a result, the re-deposition of the fine particles onto the mask substrate 11 is significantly reduced. Also, the deposition of fine particles sucked into the window port 13 onto the surface of the objective lens 15 directly underneath the laser-irradiated area is prevented.

The shape of the funnel is determined by considering NA of the object lens 15, and the window port 13 has a well-designed structure having the glass window and the opening in its center. As a result, since the observation performance or the laser image focusing performance of the objective lens 15 is not affected, it is possible to provide an excellent laser correction apparatus having high machining accuracy with a high fine pattern observation performance and a capability to remove fine particles.

A more specific example is described in detail below for the case in which the present invention is used with a laser correction apparatus which is used for an LSI photomask.

The laser source 19 is a third-harmonic laser source of Nd:YAG and emits a pulse laser of a wavelength 355 nm and a pulse width 25 ps at 10 Hz. The microscopic observation optical system 18 is composed of a high-resolution ultraviolet objective lens 15 of NA=0.9 supported by an up/down mechanism 17 operated at the minimum pitch of 0.02 μm, laser irradiation optics and ultraviolet observation optics. The window port 13 has a glass window 12 with a diameter of 3 mm in a stainless steel structure of which the outer dimensions are 6 mm thick and 60 mm in diameter. The spacing between the window port 13 and the mask substrate 11 is 0.3 mm. The glass window 12 has the round opening 16 with a diameter of 0.5 mm. An X-Y stage 20 is a stage capable of moving in increments of a minimum of 0.01 μm, and this X-Y stage 20 holds a mask substrate 11 of quartz mounting thereon a Cr pattern. The amount of air suction to the suction holes 14 can be controlled with an exhaust unit connected to a fine particle filter, flow rate control valve and vacuum pump mounted in this order on the downstream side of the gas outlets 22.

The removal of fine particles depending on the absence/presence of suction was examined under this structure. First, the state of fine particle deposition was observed under a condition where the suction was stopped.

The Cr film on the mask substrate was completely removed by two shots of a laser beam of 5 μm square. On examination, there were no particles of 0.2 μm or larger found in the periphery of the laser-irradiated area on the mask substrate 11 after irradiation. However, within a distance of 15 μm from the irradiated area particle re-deposition was seen that would decrease the transparency of ultraviolet ray by about 8%. In addition, over ten fine particles of around 0.1 μm and three fine particles of less than 0.2 μm were found stuck in the vicinity of the laser-irradiated area.

On the other hand, when the gas suction rate was set at 5 liters per minute, the decrease in ultraviolet transparency was lower than the measurement sensitivity, 2%, in the vicinity of the laser-irradiated area after the mask substrate 11 was irradiated by a laser under the same conditions as the above. Also, re-deposition of fine particles of 0.1 μm or larger was not seen. There was no reduction in the ability to observe the fine pattern in either case without gas suction or with gas suction at a rate of 5 liters per minute. However, when the suction rate was raised to 50 liters per minute or larger, vibrations of images was observed in the observation window during the observation of the fine pattern. This was probably due to turbulence in the air in the space above the objective lens. Practically, the suction rate of 5 litters per minute is high enough to remove fine particles. Under the presence of a spiral flow, there was no deposition of fine particles onto the surface of the objective lens 15 even after correcting the defects a few hundred times using the laser.

In the above description of the laser correction apparatus according to the first embodiment of the invention, the application target was a photomask of a semiconductor integrated circuit. However, it is apparent that the present invention may be applied in other areas, for example, the correction process for liquid crystal displays. For example, evaporated materials re-deposit on the substrate and may cause conductive defects in correction apparatuses that employ lasers for cutting interconnections. If the present invention for removing fine particles is applied to such correction apparatuses, the defect correction process can be performed with higher yields.

Next, a second embodiment of the invention is described with reference to the accompanying drawings.

Figure 4:
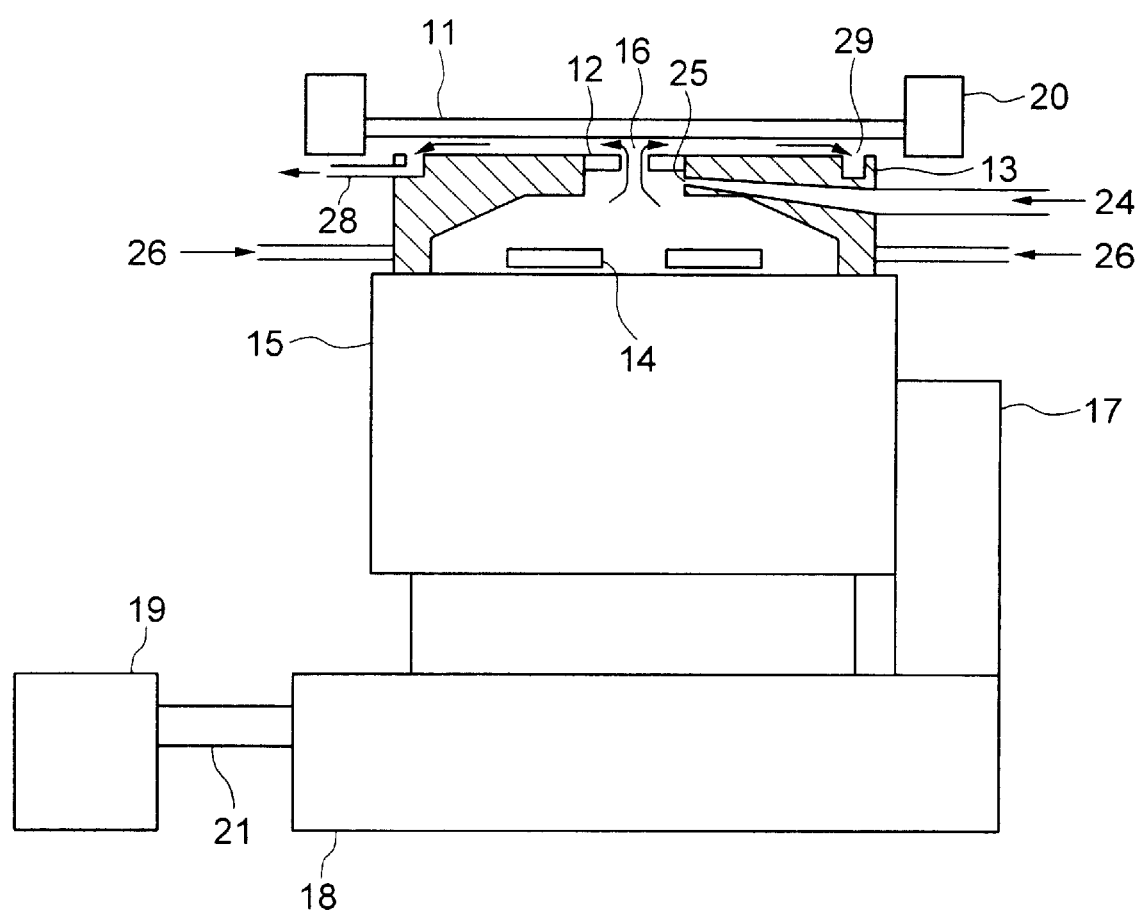
FIG. 4 is a side view including a partly sectional view of a laser correction apparatus according to a second embodiment of the present invention.

Referring to FIG. 4, there is shown the configuration of a laser correction apparatus of the present embodiment having a function of laser evaporation for correcting opaque defects and a laser CVD function for forming a film on the spot lacking in Cr film for correcting clear defects.

This figure, in addition to the components used in the opaque defect correction apparatus shown in FIG. 1, includes a raw material gas inlet port 25 that blows out the raw material gas of the CVD from the inside of the window port 13 toward the opening 16, and an intake/exhaust groove 29 as well as intake/exhaust ports 28 through which the raw material gas which has leaked to the space between the mask substrate 11 and the window port 13 is exhausted. The intake/exhaust groove 29 and ports 28 are also used for supplying an air flow from the outer periphery of the top surface of the window port 13. This structure is used in order to add the laser CVD function to the window port 13 of the present invention.

During the laser CVD operation of the laser correction apparatus for correcting a clear defect, raw material gas cylinders are connected to a raw material gas inlet 24, and the gas outlets 22 of FIG. 1 are used as purge gas inlets 26 so that Ar purge gas flows from the suction holes 14 in the window port 13. The clear defect is such that a Cr film is not deposited on the photomask at the location where the Cr film is to be deposited by the design of the LSI, for example.

Figure 5:
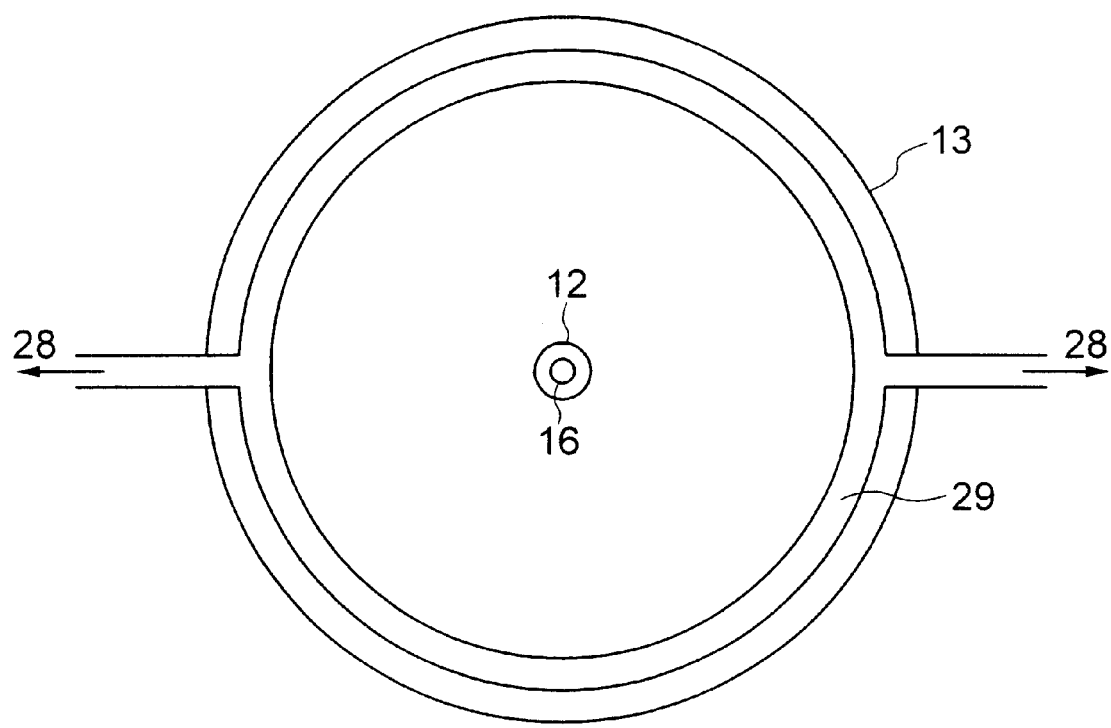
FIG. 5 is a top plan view of the window port shown in FIG. 4.

The intake/exhaust groove 29 for exhausting raw material gas and purge gas has a structure of which a top plan view is shown in FIG. 5, where it has an annular groove in the peripheral area of the top surface of the window port 13, and gas is intensively exhausted from the intake/exhaust ports 28.

This structure together with the above-described structure provides a great advantage in that even a single laser correction apparatus can have the two functions of film removal and film formation just by choosing the type of gas, and switching the direction of gas flow between opaque defect correction and clear defect correction. As a result, the added value of the laser correction apparatus is significantly enhanced.

Since the above embodiments are described only for examples, the present invention is not limited to the above embodiments and various modifications or alterations can be easily made therefrom by those skilled in the art without departing from the scope of the present invention.

What is claimed is:

1. A laser correction apparatus comprising: a laser source or emitting a laser beam; an optical system having an objective lens for irradiating upward the laser and focusing the laser onto a defect on a thin film formed on a bottom surface of a substrate to expel said defect from said substrate; a window port interposed between said bottom surface of said substrate and said objective lens, said window port including a top surface opposing said bottom surface of said substrate with a space therebetween and having a central opening for allowing the laser to pass therethrough, and an inner wall including an upper portion extending from said central opening and a lower portion having a larger diameter than said upper portion, said lower portion having a plurality of gas outlet ports therein; a plurality of gas inlet ports for introducing a gas to the space between said bottom surface of said substrate and said top surface of said window port from a periphery of said top surface toward said central opening, said central opening allowing the gas to pass therethrough toward said inner wall; and a gas exhaust section for exhausting the gas including said defect through said gas outlet ports.

2. The laser apparatus as defined in claim 1, wherein said window port is configured to allow the gas to flow downward in a spiral manner while the gas increases in diameter during the flow downward.

3. The laser correction apparatus as defined in claim 1, wherein said top surface of said window port has a plurality of protrusions for guiding the gas toward said central opening in a spiral flow.

4. The laser correction apparatus as defined in claim 1, wherein said gas outlet ports are arranged in symmetry with respect to a central axis of said inner wall.

5. The laser correction apparatus as defined in claim 1, wherein said gas outlet ports flow out the gas in a circumferential direction of said inner wall.

6. The laser correction apparatus as defined in claim 1, wherein said inner wall of said window port has a material gas inlet port and a plurality of purge gas inlet port.

7. The laser correction apparatus as defined in claim 6, wherein said top surface of said window port has an annular groove in a vicinity of the periphery of said top surface.

8. A method for correcting a defect on a thin film formed on a bottom surface of a substrate said method comprising:

irradiating upward a focused laser onto the defect through a central opening of a window port to expel said defect from said bottom surface while blowing a gas to a space from the periphery of a top surface of said window port and exhausting the gas including said defect through said central opening of said window port and exhaust ports.

9. A method for correcting a defect on a thin film formed on a bottom surface of a substrate, said method comprising:

irradiating a focused laser upward onto an opaque defect through a central opening of a window port while blowing a gas to a space from a periphery of a top surface of a window port and exhausting the gas including said opaque defect through said central opening of said window port and exhaust ports; and irradiating a focused laser onto a clear defect through the central opening while blowing a material gas and a purge gas from a material gas inlet port and a purge gas inlet port and exhausting the material gas and the purge gas in a vicinity of said periphery of said top surface.

* * * * *